(12) United States Patent
Park et al.

(10) Patent No.: US 9,660,010 B2
(45) Date of Patent: May 23, 2017

(54) ORGANIC LIGHT EMITTING DISPLAY DEVICE

(71) Applicant: Samsung Display Co., LTD., Yongin, Gyeonggi-Do (KR)

(72) Inventors: Sang-Ho Park, Suwon-si (KR); Joung-Keun Park, Asan-si (KR); Ki-Wan Ahn, Seoul (KR); Joo-Sun Yoon, Seoul (KR); Seung-Min Lee, Jeju-si (KR); Yong-Jae Jang, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/728,647

(22) Filed: Jun. 2, 2015

(65) Prior Publication Data

US 2016/0035809 A1 Feb. 4, 2016

(30) Foreign Application Priority Data

Jul. 30, 2014 (KR) ........................ 10-2014-0097074

(51) Int. Cl.
*H01L 29/08* (2006.01)
*H01L 27/32* (2006.01)
*H01L 51/52* (2006.01)

(52) U.S. Cl.
CPC ........ *H01L 27/3265* (2013.01); *H01L 27/326* (2013.01); *H01L 27/3258* (2013.01);
(Continued)

(58) Field of Classification Search
CPC ............. H01L 27/3265; H01L 27/3258; H01L 27/326; H01L 27/3276; H01L 27/3246; H01L 27/3262; H01L 51/5206
(Continued)

(56) References Cited

U.S. PATENT DOCUMENTS

| | | | |
|---|---|---|---|
| 6,515,428 B1* | 2/2003 | Yeh | ........................ H01L 27/322 |
| | | | 313/489 |
| 7,994,706 B2* | 8/2011 | Choi | ................... H01L 27/3248 |
| | | | 313/504 |

(Continued)

FOREIGN PATENT DOCUMENTS

| | | |
|---|---|---|
| KR | 1020060001373 A | 1/2006 |
| KR | 1020110122513 A | 11/2011 |

(Continued)

*Primary Examiner* — Xinning Niu
*Assistant Examiner* — Vu A Vu
(74) *Attorney, Agent, or Firm* — Innovation Counsel LLP

(57) ABSTRACT

An organic light emitting display device includes a substrate, a first insulating layer, a extension of a drain electrode, a second insulating layer, a first electrode, an emission layer, and a second electrode. The substrate has a display region and a transparent region. The first insulating layer is disposed on the substrate. The extension of drain electrode is disposed on the first insulating layer. The second insulating layer is disposed on the extension of a drain electrode such that an edge portion of the extension of a drain electrode is free from overlap with the second insulating layer. The first electrode is disposed on the second insulating layer and in contact with the edge portion of the extension of a drain electrode. The emission layer is disposed on the first electrode. The second electrode is disposed on the emission layer.

19 Claims, 15 Drawing Sheets

(52) U.S. Cl.
CPC ...... *H01L 27/3276* (2013.01); *H01L 27/3246* (2013.01); *H01L 27/3262* (2013.01); *H01L 51/5206* (2013.01)

(58) Field of Classification Search
USPC .......................................................... 257/40
See application file for complete search history.

(56) References Cited

U.S. PATENT DOCUMENTS

| 2007/0222368 | A1* | 9/2007 | Lee | H01L 51/5262 313/503 |
| 2012/0146060 | A1* | 6/2012 | Moon | H01L 27/3276 257/88 |
| 2015/0001500 | A1* | 1/2015 | Sung | H01L 51/52 257/40 |
| 2015/0008400 | A1* | 1/2015 | Kim | H01L 27/329 257/40 |

FOREIGN PATENT DOCUMENTS

| KR | 1020130093328 A | 8/2013 |
| KR | 1020140024535 A | 3/2014 |

* cited by examiner

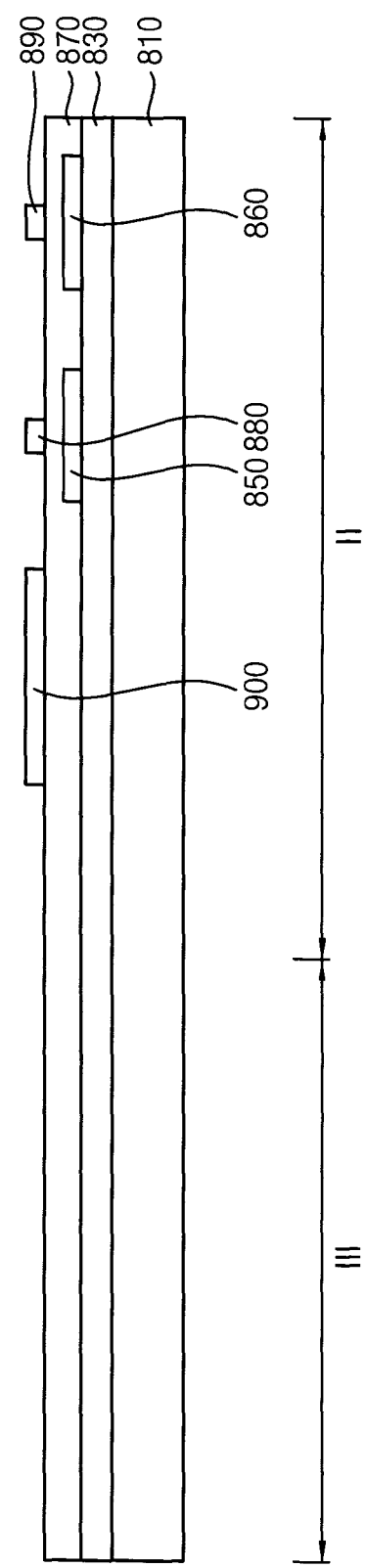

ORGANIC LIGHT EMITTING DISPLAY DEVICE

CROSS REFERENCE TO RELATED APPLICATION

This application claims priority under 35 U.S.C. §119 to Korean patent Application No. 10-2014-0097074 filed on Jul. 30, 2014, the disclosure of which is hereby incorporated by reference herein in its entirety.

BACKGROUND

1. Technical Field

Example embodiments of the present system and method relate to organic light emitting display devices. More particularly, example embodiments of the present system and method relate to organic light emitting display devices with an anode electrode that covers a first portion of an extension of a drain electrode.

2. Description of the Related Art

A flat panel display (FPD) device is widely used as a display device of an electronic device because the flat panel display device is lightweight and thin compared to a cathode-ray tube (CRT) display device. Examples of the flat panel display device include a liquid crystal display (LCD) device and an organic light emitting diode (OLED) display device. Compared to the LCD, the OLED has many advantages such as a higher luminance and a wider viewing angle. In addition, the OLED display device can generally be made thinner because the OLED display device does not require a backlight. In the OLED display device, electrons and holes are injected into an organic thin layer through a cathode and an anode, and then recombined in the organic thin layer to generate excitons and thereby cause a light of a certain wavelength to be emitted.

A transparent organic light emitting display device that includes a transparent window positioned in a transparent region and pixels positioned in a display region has been developed. In the transparent organic light emitting display device, objects or images located opposite to the transparent organic light emitting display device are visible via the transparent window. The light transmittivity of the transparent organic light emitting display device is proportional to the area of the transparent window. Generally, higher transmittivity means the objects or images located opposite to the transparent organic light emitting display device are more clearly visible. However, in the conventional transparent organic light emitting display device, increasing the area of the transparent window is difficult because of the surrounding structures (e.g., wires or electrodes, insulating layers, etc) positioned adjacent to the transparent window.

SUMMARY

Example embodiments provide organic light emitting display devices with an anode electrode that covers a first portion of an extension of a drain electrode.

According to an example embodiment, is the present system and method provides an organic light emitting display device that includes a substrate, a first insulating layer, an extension of a drain electrode, a second insulating layer, a first electrode, an emission layer, and a second electrode. The substrate has a display region and a transparent region. The first insulating layer is disposed on the substrate. The extension of a drain electrode is disposed on the first insulating layer. The second insulating layer is disposed on the extension of a drain electrode and exposes an edge portion of the extension of a drain electrode. That is, the edge portion of the extension of a drain electrode is free from overlap with the second insulating layer. The first electrode is disposed on the second insulating layer and in contact with the edge portion of the extension of a drain electrode. The emission layer is disposed on the first electrode. The second electrode is disposed on the emission layer.

In an example embodiment, the first electrode may cover the edge portion of the extension of a drain electrode and may be positioned adjacent to a boundary of the display region and the transparent region.

In an example embodiment, the first electrode may extend onto the first insulating layer.

In an example embodiment, the extension of a drain electrode may be electrically connected to the first electrode, and may be surrounded by the first electrode and the second insulating layer.

In an example embodiment, the organic light emitting display device may further include a pixel defining layer.

In an example embodiment, the pixel defining layer may be disposed on the first insulating layer and may cover the first electrode positioned on the extension of a drain electrode.

In an example embodiment, the pixel defining layer may include a transparent material.

In an example embodiment, the pixel defining layer may include a first opening and a second opening.

In an example embodiment, the first opening may be positioned in the display region, and the emission layer may be disposed in first opening.

In an example embodiment, a second opening may be positioned in the transparent region.

In an example embodiment, the second opening may be formed by removing the pixel defining layer.

In an example embodiment, the second electrode may extend into the second opening.

In an example embodiment, the second opening may be formed by removing the pixel defining layer and the first insulating layer.

In an example embodiment, the extension of a drain electrode and the first electrode may be disposed in the display region.

In an example embodiment, the organic light emitting display device may further include at least one semiconductor device disposed between the substrate and the second insulating layer, an insulating interlayer disposed on the substrate, and a capacitor disposed between the insulating interlayer and the extension of a drain electrode.

In an example embodiment, the at least one semiconductor device may include a first semiconductor that includes a first active pattern disposed on the substrate, the insulating interlayer may be disposed on the first active pattern, a first gate electrode may be disposed on the insulating interlayer, the extension of a drain electrode may contact a first portion of the first active pattern and extend adjacent to a boundary of the display region and the transparent region, and a first drain electrode may contact a second portion of the first active pattern.

In an example embodiment, the capacitor may include a lower electrode disposed on the insulating interlayer, an upper electrode contacting an extended portion of the extension of a drain electrode and disposed on the lower electrode, and a gate insulating layer disposed between the lower electrode and the upper electrode.

In an example embodiment, the lower electrode and the first gate electrode may be positioned at a same level on the insulating interlayer.

In an example embodiment, a power supply voltage may be applied to the first electrode, the first portion of the first active pattern, and the upper electrode via the extension of a drain electrode.

In an example embodiment, the gate insulating layer may include materials that are substantially the same as materials of the first insulating layer.

In an example embodiment, the at least one semiconductor device may include a second semiconductor that includes a second active pattern disposed on the substrate, the insulating interlayer may be disposed on the second active pattern, a second gate electrode may be disposed on the insulating interlayer, a second source electrode may contact a first portion of the second active pattern, and a second drain electrode may contact a second portion of the second active pattern.

According to an example embodiment of an organic light emitting display device in which an edge portion of a extension of a drain electrode is free from overlap with an anode electrode, the area of a transparent window may be increased.

BRIEF DESCRIPTION OF THE DRAWINGS

Example embodiments are described herein with reference to the accompanying drawings, in which:

FIGS. 7A, 7B, 7C, 7D, 7E, 7F, 7G, 7H, and 7I are cross-sectional views illustrating a method of manufacturing an organic light emitting display device in accordance with an example embodiment.

DESCRIPTION OF EMBODIMENTS

Figure 1:
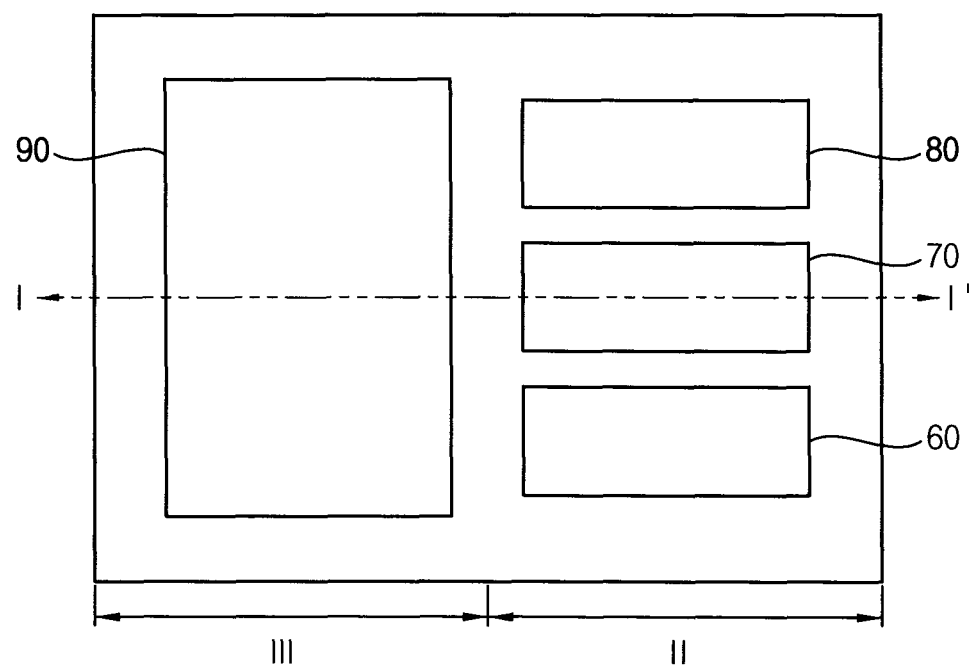
FIG. 1 is a plan view illustrating a conventional organic light emitting display device.

Hereinafter, example embodiments of the present system and method are be described with reference to the accompanying drawings. In the drawings, identical or similar reference numerals may represent identical or similar elements.

FIG. 1 is a plan view illustrating a conventional organic light emitting display device, according to an embodiment of the present system and method. Referring to FIG. 1, an organic light emitting display device includes a display region II and a transparent region III. Pixels 60, 70, and 80 are positioned in the display region II, and a transparent window 90 is positioned in the transparent region III.

As an example, the pixel 60 may be a pixel emitting a red color, the pixel 70 may be a pixel emitting a green color, and the pixel 80 may be a pixel emitting a blue color. The transparent window 90 transmits light emitted from an external source (not shown). The wires or lines (e.g., data lines, scan lines, power supply electrodes, etc) and insulating layers (e.g., a pixel defining layer, VIA layer, etc) are disposed in an area (e.g., a dead space) surrounding the pixels 60, 70, and 80 and the transparent window 90.

Figure 2:
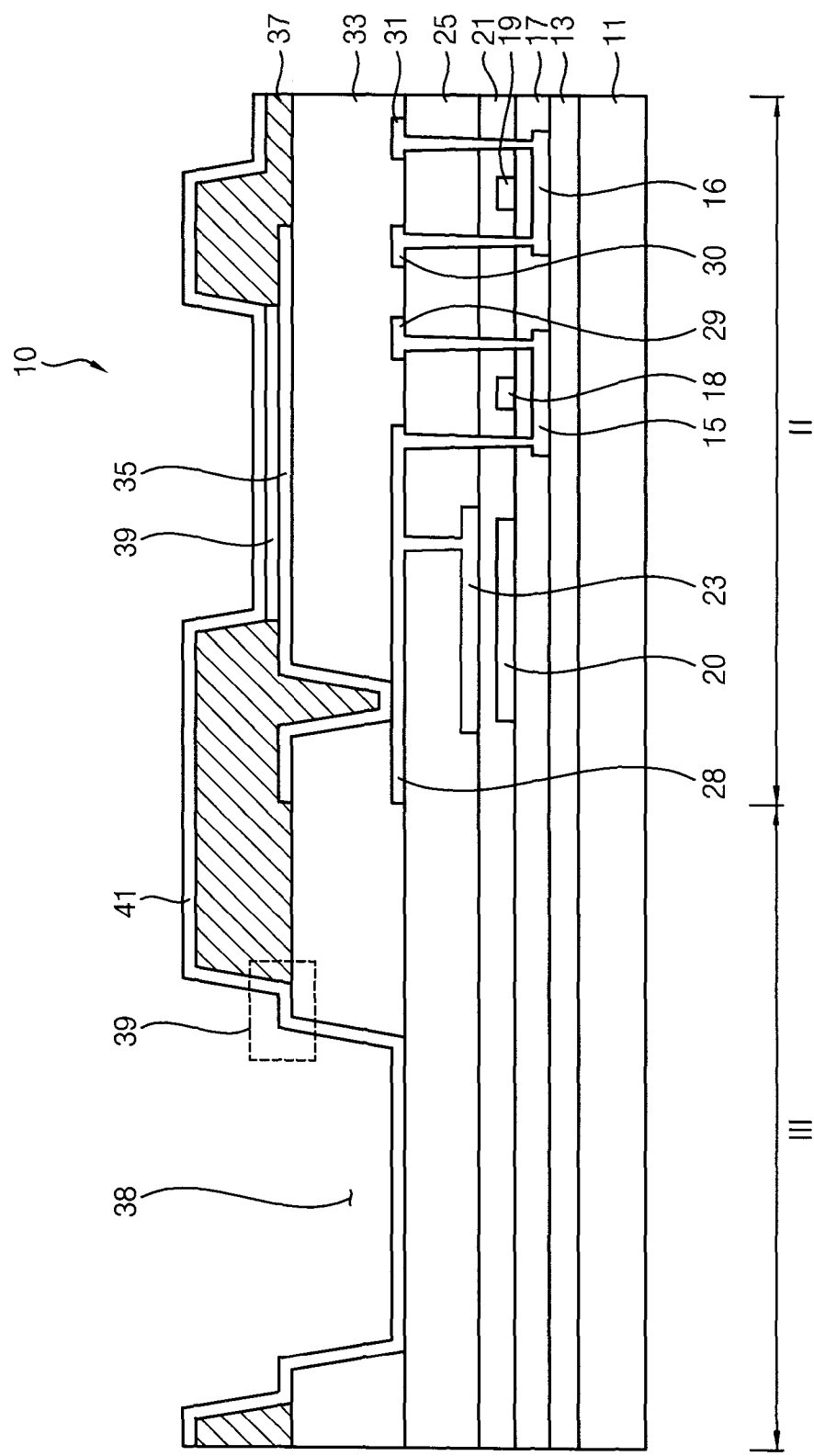
FIG. 2 is a cross-sectional view illustrating a conventional organic light emitting display device taken along a line I-I' in FIG. 1.

FIG. 2 is a cross-sectional view illustrating a conventional organic light emitting display device taken along a line I-I' in FIG. 1. Referring to FIG. 2, a conventional organic light emitting display device 10 includes a driving transistor, a switching transistor, a storage capacitor, an extension of a drain electrode 28, a buffer layer 13, insulating layers 17, 21, 25, and 33, a pixel defining layer 37, an anode electrode 35, an emission layer 39, a cathode electrode 41, a transparent window 38, and a protruding portion 39. Here, the driving transistor may have a first active pattern 15, a first gate electrode 18, a first source electrode, and a first drain electrode 29. The switching transistor may have a second active pattern 16, a second gate electrode 19, a second source electrode 30, and a second drain electrode 31. The storage capacitor may have a first capacitor electrode 20 and a second capacitor electrode 23. In addition, the conventional organic light emitting display device 10 includes a display region II and a transparent region III. The anode electrode 35 is disposed on the insulating layer 33 and connected to the extension of a drain electrode 28 through a hole in the insulating layer 33.

The insulating layer 33, the pixel defining layer 37, and the cathode electrode 41 are disposed in the transparent region III. For example, the pixel defining layer 37 is disposed on the insulating layer 33. The insulating layer 33 and the pixel defining layer 37 surround the transparent window 38. The cathode electrode 41 is disposed on the insulating layer 33 and the pixel defining layer 37 such that a profile of the insulating layer 33 and the pixel defining layer 37 includes the protruding portion 39. The protruding portion 39, however, reduces the area, and therefore the light transmittivity, of the transparent window 38. Furthermore, the definition of objects or images located opposite to the conventional organic light emitting display device 10 may be reduced by the occurrence of a light diffraction phenomenon.

Figure 3:
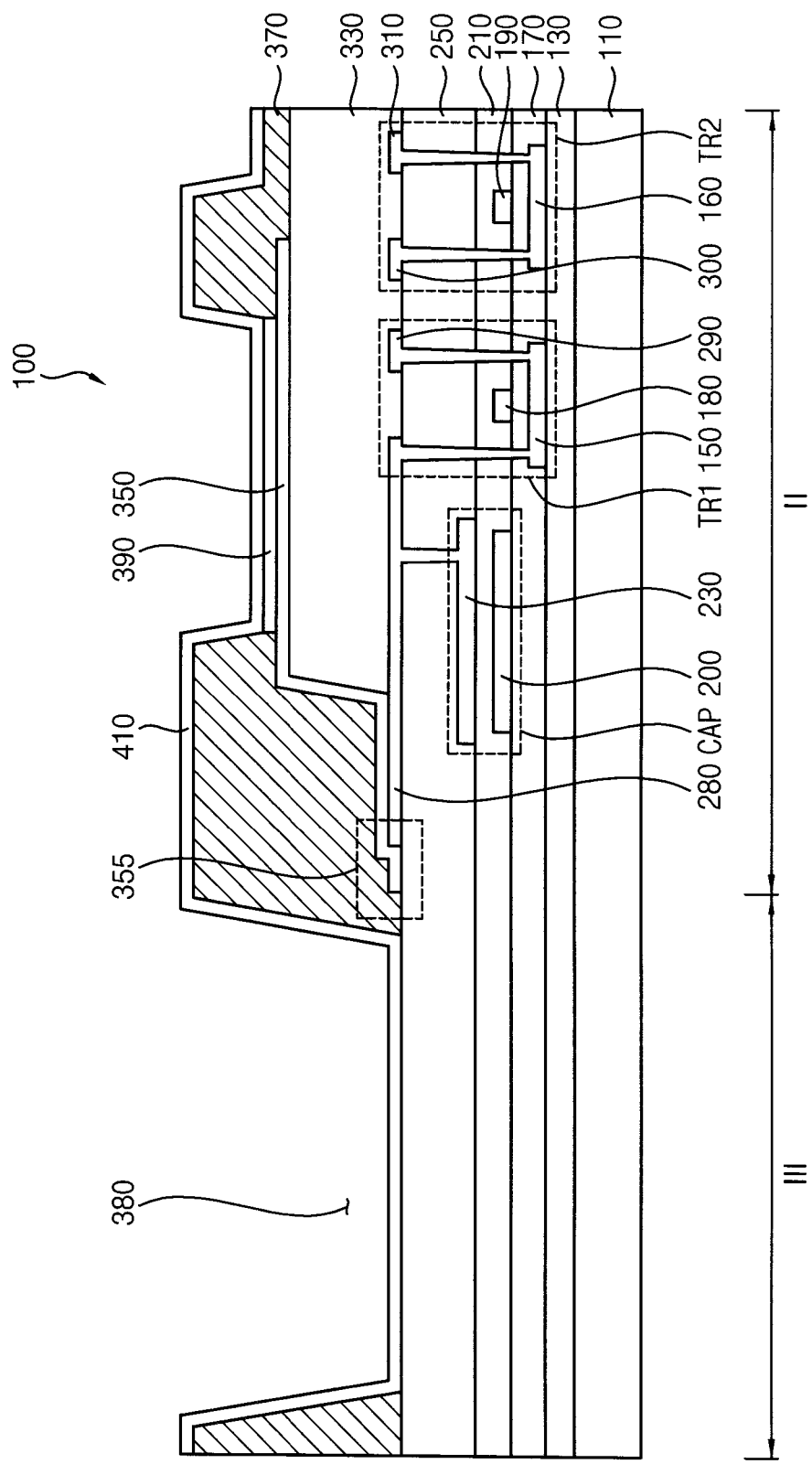
FIG. 3 is a cross-sectional view illustrating an organic light emitting display device in accordance with an example embodiment.

FIG. 3 is a cross-sectional view illustrating an organic light emitting display device in accordance with an example embodiment. Referring to FIG. 3, an organic light emitting display device 100 includes a substrate 110, a driving transistor TR1, a switching transistor TR2, a storage capacitor CAP, an extension of a drain electrode 280, a buffer layer 130, an insulating interlayer 170, a gate insulating layer 210, a first insulating layer 250, a second insulating layer 330, a first electrode 350, a pixel defining layer 370, a transparent window 380, an emission layer 390, and a second electrode 410.

In the example embodiment of FIG. 3, the organic light emitting display device 100 includes a display region II and a transparent region III. The driving transistor TR1, the switching transistor TR2, the storage capacitor CAP, the extension of a drain electrode 280, the second insulating layer 330, the first electrode 350, the emission layer 390 are positioned in the display region II. An image may be displayed in the display region II. The transparent window 380 is positioned in the transparent region III such that objects or images located opposite to the organic light emitting display device 100 in the transparent region III may be visible.

The substrate 110 may include a transparent inorganic material or flexible plastic such as, for example, a glass substrate and/or a quartz substrate. The substrate 110 may include a flexible transparent resin substrate such as, for example, a polyimide substrate. The polyimide substrate may include a first polyimide layer, a barrier film layer, and a second polyimide layer. If the polyimide substrate is thin and flexible, the polyimide substrate may be formed on a rigid glass substrate to help support the formation of upper structures. That is, in an example embodiment, the substrate 110 may have a structure in which the first polyimide layer, the barrier film layer and the second polyimide layer are stacked on a glass substrate that may be removed later on.

For example, consistent with an embodiment in which a glass substrate is used, after an insulation layer is provided on the second polyimide layer, upper structures including a light emitting structure (e.g., the driving transistor TR1, the switching transistor TR2, the storage capacitor CAP, the extension of a drain electrode 280, the first electrode 350, the emission layer 390, the second electrode 410, etc) may be disposed on the insulation layer. This allows the upper structures to be formed with rigid support provided by the glass substrate. After the upper structures are formed on the insulation layer, the glass substrate may be removed. That is, the polyimide substrate may serve as the substrate 110 after the removal of the glass substrate. As the organic light emitting display device 100 shown in FIG. 3 includes the display region II and the transparent region III, the substrate 110 also includes the display region II and the transparent region III.

As illustrated in FIG. 3, the buffer layer 130 is disposed on the substrate 110 and extends from the display region II into the transparent region III. The buffer layer 130 provides a planar surface even if a surface of the substrate 110 is relatively irregular. The buffer layer 130 prevents the diffusion (e.g., an out gassing) of metal atoms and/or impurities from the substrate 110. Additionally, the buffer layer 130 controls the rate of heat transfer in a crystallization process for forming a first active pattern 150 and a second active pattern 160, thereby obtaining substantial uniformity in the first and the second active patterns 150 and 160. The buffer layer 130 may include, for example, silicon nitride and silicon oxide.

In some example embodiments, only one buffer layer or no buffer layer may be provided on the substrate 110, depending on the type of the substrate 110. If the buffer layer 130 includes silicon oxide, external light traveling through the transparent region III of the organic light emitting display device 100 may be transmitted by the buffer layer 130. In some example embodiments, depending on the type of the substrate 110, at least two buffer layers may be provided on the substrate 110, or no buffer layer may be provided.

The driving transistor TR1 is disposed on the buffer layer 130 in the example embodiment of FIG. 3. The driving transistor TR1 includes the first active pattern 150, the insulating interlayer 170, a first gate electrode 180, the gate insulating layer 210, the first insulating layer 250, a first source electrode, and a first drain electrode 290. The first source electrode is connected to the extension of a drain electrode 280 through which a high power supply voltage ELVDD may be applied to the first source electrode. The organic light emitting display device 100 may further include a low power supply electrode (not shown). In such case, a low power supply voltage ELVSS may be provided to the low power supply electrode.

The switching transistor TR2 is also disposed on the buffer layer 130, as FIG. 3 illustrates. The switching transistor TR2 includes the second active pattern 160, the insulating interlayer 170, a second gate electrode 190, the gate insulating layer 210, the first insulating layer 250, a second source electrode 300, and a second drain electrode 310.

FIG. 3 further illustrates the storage capacitor CAP as being disposed on the insulating interlayer 170. The storage capacitor CAP includes a first capacitor electrode 200, the gate insulating layer 210, and a second capacitor electrode 230. The second capacitor electrode 230 is connected to the extension of a drain electrode 280 through which the high power supply voltage ELVDD may be applied to the second capacitor electrode 230.

In the illustrative embodiment of FIG. 3, the driving transistor TR1 and the switching transistor TR2 are positioned in the display region II. The first and second active patterns 150 and 160 in the driving transistor TR1 and the switching transistor TR2, respectively, are spaced apart from each other on the buffer layer 130 by a predetermined distance. Each of the first and second active patterns 150 and 160 may be a semiconductor device and may include an active layer containing oxide semiconductor, inorganic semiconductor (e.g., amorphous silicon, polysilicon, etc.), and organic semiconductor.

The insulating interlayer 170 is disposed on the buffer layer 130 of FIG. 3, while covering the first and second active patterns 150 and 160 and extending into the transparent region III. The insulating interlayer 170 may include, for example, a silicon compound (e.g., silicon oxide) and/or a metal oxide. The insulating interlayer 170 may include materials that are substantially the same as those of the buffer layer 130. In such case, in which the insulating interlayer 170 and the buffer layer 130 are formed of the same material in the transparent region III, the insulating interlayer 170 and the buffer layer 130 have the same refractive index, and the light transmittivity is improved in the transparent region III.

The first gate electrode 180 of FIG. 3 is disposed on the insulating interlayer 170 under which the first active pattern 150 is positioned. The second gate electrode 190 is disposed on the insulating interlayer 170 under which the second active pattern 160 is positioned. Each of the first gate electrode 180 and the second gate electrode 190 may include, for example, a metal, an alloy, a metal nitride, a conductive metal oxide, and/or a transparent conductive material.

The first capacitor electrode 200 of FIG. 3 is disposed on the insulating interlayer 170 and spaced apart from the first gate electrode 180 by a predetermined distance. The first capacitor electrode 200, the first gate electrode 180, and the second gate electrode 190 may include substantially the same material or different materials.

The gate insulating layer 210 of FIG. 3 is disposed on the insulating interlayer 170, while covering the first capacitor electrode 200, the first gate electrode 180, and the second gate electrode 190 and extending into the transparent region III. The gate insulating layer 210 may include, for example, a silicon compound (e.g., silicon oxide) and/or a metal oxide. The gate insulating layer 210 may include materials that are substantially the same as those of the buffer layer 130 and the insulating interlayer 170. In such case, in which the gate insulating layer 210, the insulating interlayer 170 and the buffer layer 130 are formed of the same material in the transparent region III, the gate insulating layer 210, the insulating interlayer 170 and the buffer layer 130 have the same refractive index, and the light transmittivity is improved in the transparent region III.

The second capacitor electrode 230 of FIG. 3 is disposed on the gate insulating layer 210 under which the first capacitor electrode 200 is positioned. The second capacitor electrode 230 may include materials that are substantially the same as those of the first gate electrode 180, the second gate electrode 190, and the first capacitor electrode 200. In some cases, each of the second capacitor electrode 230, the first gate electrode 180, the second gate electrode 190, and the first capacitor electrode 200 may include different materials.

The first insulating layer 250 of FIG. 3 is disposed on the gate insulating layer 210, while covering the second capacitor electrode 230 and extending into the transparent region III. The first insulating layer 250 may include, for example, a silicon compound (e.g., silicon oxide) and/or a metal oxide. The first insulating layer 250 may include materials that are substantially the same as those of the gate insulating layer 210, the buffer layer 130 and the insulating interlayer 170. In such case, in which the first insulating layer 250, the gate insulating layer 210, the insulating interlayer 170 and the buffer layer 130 are formed of the same material in the transparent region III, the first insulating layer 250, the gate insulating layer 210, the insulating interlayer 170 and the buffer layer 130 have the same refractive index, and the light transmittivity is improved in the transparent region III. As a result, the definition of objects or images located opposite to the organic light emitting display device 100 is increased.

As FIG. 3 shows, the thickness of the first insulating layer 250 may be substantially greater than that of the gate insulating layer 210. As the thickness the first insulating layer 250 increases relative to that of the gate insulating layer 210, a coupling phenomenon that is generated between the extension of a drain electrode 280 and the second capacitor electrode 230 reduces.

In the illustrative embodiment of FIG. 3, the extension of a drain electrode 280, the first source electrode of the driving transistor TR1, the first drain electrode 290 of the driving transistor TR1, the second source electrode 300 of the switching transistor TR2, the second drain electrode 310 of the switching transistor TR2, a portion of the second insulating layer 330, and a portion of the first electrode 350 are disposed in the display region II of the first insulating layer 250. A portion of the pixel defining layer 370 and a portion of the second electrode 410 are disposed in the transparent region III of the first insulating layer 250.

The first source electrode and the first drain electrode 290 of FIG. 3 are in electrical contact with the first active pattern 150 through holes in the first insulating layer 250, the gate insulating layer 210, and the insulating interlayer 170. Each of the first source electrode and the first drain electrode 290 may include, for example a metal, an alloy, a metal nitride, a conductive metal oxide, a transparent conductive material, or a combination thereof.

The second source electrode 300 and the second drain electrode 310 of FIG. 3 are in electrical contact with the second active pattern 160 through holes in the first insulating layer 250, the gate insulating layer 210, and the insulating interlayer 170. Each of the second source electrode 300 and the second drain electrode 310 may include materials that are substantially the same as those of the first source electrode and the first drain electrode 290.

The extension of a drain electrode 280 of FIG. 3 is in electrical contact with the second capacitor electrode 230 through a hole in the first insulating layer 250. Furthermore, because the extension of a drain electrode 280 is connected to the first source electrode, the extension of a drain electrode 280 is also in electrical contact with the first active pattern 150. Thus, when the high power supply voltage ELVDD is applied to the extension of a drain electrode 280, the high power voltage ELVDD is also provided to the second capacitor electrode 230 and the first active pattern 150. The extension of a drain electrode 280 may include materials that are substantially the same as those of the first drain electrode 290, the second source electrode 300, and the second drain electrode 310.

The second insulating layer 330 of FIG. 3 covers the first source electrode, the first drain electrode 290, the second source electrode 300, and the second drain electrode 310. Particularly, the second insulating layer 330 is disposed such that the second insulating layer 330 overlaps with a portion of the extension of a drain electrode 280. That is, at least a portion of the extension of a drain electrode 280 is exposed by the second insulating layer 330. The second insulating layer 330 may include an inorganic or organic material. For example, in the case of an inorganic material, the second insulating layer 330 may include a silicon compound such as silicon oxide (SiOx), silicon nitride (SiNx), silicon oxynitride (SiOxNy), silicon oxycarbide (SiOxCy), silicon carbonitride (SiCxNy), or a combination thereof In the case of an organic material, the second insulating layer 330 may include, for example, polyimide-based resin, photoresist, acrylic-based resin, polyamide-based resin, siloxane-based resin, or a combination thereof.

The first electrode 350 of FIG. 3 is disposed on a portion of the first insulating layer 250, a portion of the extension of a drain electrode 280, and a portion of the second insulating layer 330 in the display region II. The first electrode 350 may be disposed to have a substantially uniform thickness along a profile of the extension of a drain electrode 280 and the second insulating layer 330. As FIG. 3 illustrates, the second insulating layer 330 overlaps with only a portion of the extension of a drain electrode 280. An edge portion of the extension of a drain electrode 280 is free from overlap with the second insulating layer 330.

In addition, in a portion adjacent to a boundary of the display region II and the transparent region III, the first electrode 350 covers the extension of a drain electrode 280 such that the extension of a drain electrode 280 is not exposed to the outside and extends onto the first insulating layer 250. That is, as FIG. 3 shows, a stepped portion 355 is formed adjacent to the boundary of the display region II and the transparent region III such that at least a portion of the first electrode 350 contacts the first insulating layer 250. Because the first electrode 350 covers the top portion of the extension of a drain electrode 280 that is exposed by the second insulating layer 330, and the stepped portion 355 of the first electrode 350 covers the side walls of the extension of a drain electrode 280, the extension of a drain electrode 280 is protected from outside elements. For example, if the first electrode 350 does not include the stepped portion 355 and is formed of a different material than the extension of a drain electrode 280, the extension of a drain electrode 280 can be damaged by etching materials during an etching process.

According to an example embodiment in which a width (e.g., a length of the extension of a drain electrode 280 in the horizontal direction of FIG. 3) of the extension of a drain electrode 280 is reduced, the stepped portion 355 may be disposed more closely to the second insulating layer 330, thereby increasing the area of the transparent region III. In such case, however, reducing the width of the extension of a drain electrode 280 may cause an IR drop in the organic light emitting display device 100 because a line resistance may be increased. An IR drop may degrade the quality of an image displayed in the organic light emitting display device 100. Accordingly, the width of the extension of a drain electrode 280 may be determined so as to not cause an IR drop.

The first electrode 350 may include a metal, an alloy, a metal nitride, a conductive metal oxide, a transparent conductive material, or a combination thereof. For example, the first electrode 350 may include aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), stannum oxide (SnOx), indium oxide (InOx), gallium oxide (GaOx), indium zinc oxide (IZO), or a combination thereof.

The pixel defining layer 370 of FIG. 3 is disposed on the first electrode 350, a portion of the second insulating layer 330, and a portion of the first insulating layer 250. The pixel defining layer 370 includes a first opening and a second opening and covers the stepped portion 355. The first opening of the pixel defining layer 370 is positioned in the display region II and exposes a portion of the first electrode 350 on which the emission layer 390 is disposed. The second opening of the pixel defining layer 370 is positioned in the transparent region III and defines the transparent window 380. The pixel defining layer 370 may include an organic material, an inorganic material, or a combination thereof. The pixel defining layer 370 may include materials that are substantially the same as those of the second insulating layer 330.

The emission layer 390 of FIG. 3 is disposed on the portion of the first electrode 350 that is exposed by the first opening of the pixel defining layer 370. The emission layer 390 may be formed of light emitting materials that are capable of generating different colors of light (e.g., red color light, blue color light, and green color light). The emission layer 390 may include multilayers of light emitting materials, wherein each layer is capable of generating a different color of light, such as red color light, green color light, and blue color light, so that white light may be produced by the combination of the different color lights.

The second electrode 410 of FIG. 3 is disposed on the pixel defining layer 370, the emission layer 390, and the first insulating layer 250. The second electrode 410 may be disposed with a substantially uniform thickness along a profile of the pixel defining layer 370, the emission layer 390, and the first insulating layer 250. The second electrode 410 is in contact with a portion of the first insulating layer 250 via the second opening of the pixel defining layer 370 and extends into the transparent region III. That is, the second electrode 410 extends into the second opening towards the first insulating layer 250. The second electrode 410 may include a transparent conductive material so that the second electrode 410 positioned in the transparent region III does not significantly reduce the light transmittivity of the transparent region III. For example, the second electrode 410 may include ITO, SnOx, InOx, GaOx, and/or IZO, which does not substantially reduce the light transmittivity of the transparent region III. The second electrode 410 may include materials that are substantially the same as those of the first electrode 350.

As shown in FIG. 2, the surface area of a transparent region III in the conventional organic light emitting display 10 is reduced because the anode electrode 35 connects to the extension of a drain electrode 28 through a hole in the insulating layer 33, and a protruding portion 39 of a cathode electrode 41 is generated. In contrast, the present system and method provide an organic light emitting display device in which the surface area of the transparent window in the transparent region III is increased from that of the conventional organic light emitting display device. According to the example embodiment of FIG. 3, the relative increase in size may be achieved by connecting the first electrode 350 to the extension of a drain electrode 280 at their overlapping edge portions where an edge portion of the second insulating layer 330 is not formed or removed. In addition, because the edge portion of the second insulating layer 330 is not formed or removed, the protruding portion 39 is not formed in the transparent region III of FIG. 3 and, therefore, does not cause a light diffraction phenomenon. Accordingly, the present system and method provide an organic light emitting display device in which the light transmittivity, and thereby the definition of objects or images located opposite to the organic light emitting display device, is increased due to the increased area of the transparent window.

Figure 4:
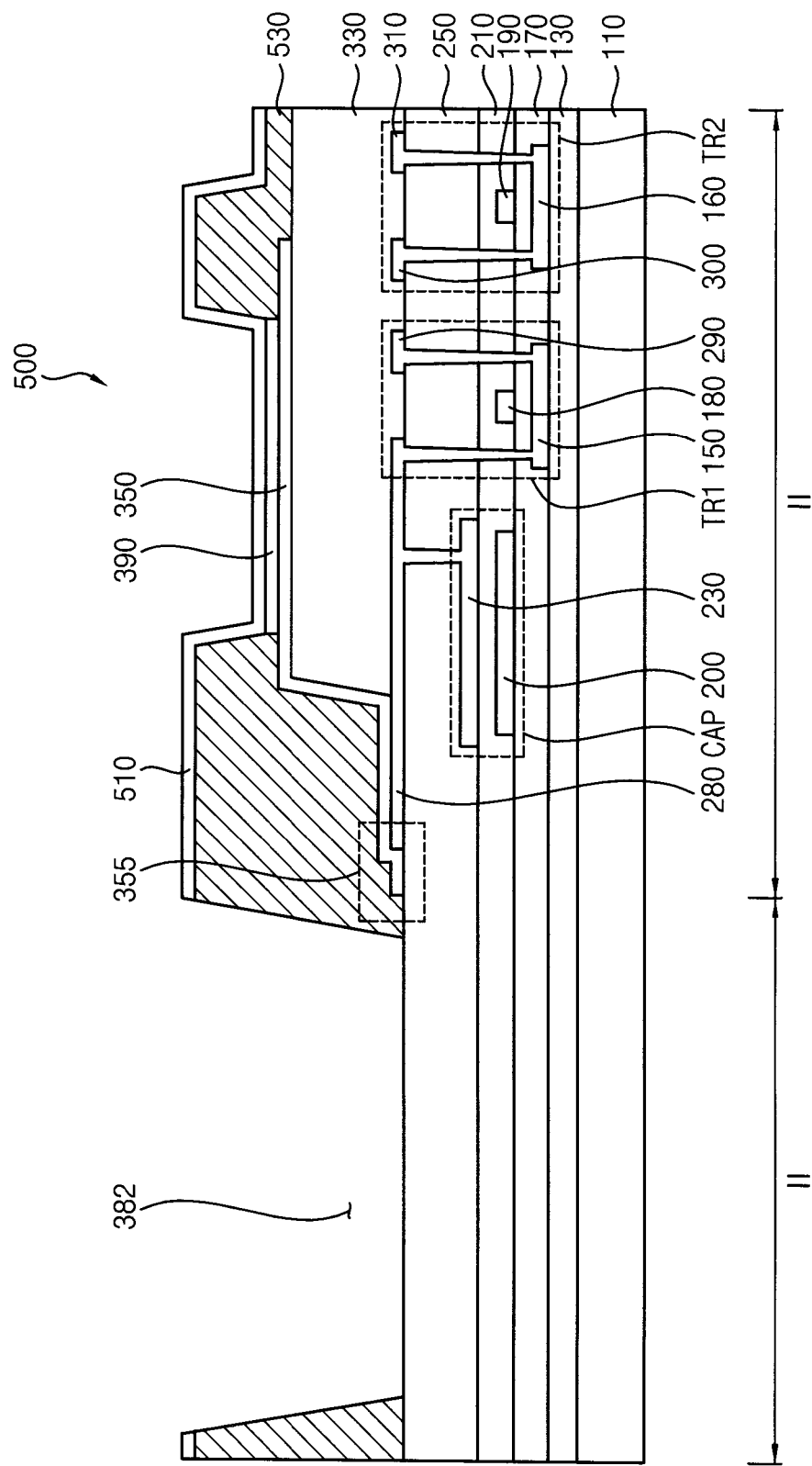
FIG. 4 is a cross-sectional view illustrating an organic light emitting display device in accordance with an example embodiment.

FIG. 4 is a cross-sectional view illustrating an organic light emitting display device in accordance with an example embodiment. FIG. 4 shows an organic light emitting display device 500 that differs from that of FIG. 3 at least in the shape of a transparent window 382, a pixel defining layer 530, and a second electrode 510. For elements of FIG. 4 that are substantially the same as or similar to the elements described earlier with reference to FIG. 3, their descriptions are omitted.

Referring to FIG. 4, an organic light emitting display device 500 includes a substrate 110, a driving transistor TR1, a switching transistor TR2, a storage capacitor CAP, an extension of a drain electrode 280, a buffer layer 130, an insulating interlayer 170, a gate insulating layer 210, a first insulating layer 250, a second insulating layer 330, a first electrode 350, a pixel defining layer 530, a transparent window 382, an emission layer 390, and a second electrode 510.

The pixel defining layer 530 of FIG. 4 is disposed on the first electrode 350, a portion of the second insulating layer 330, and a portion of the first insulating layer 250. The pixel defining layer 530 includes a first opening and a second opening and covers a stepped portion 355. The first opening of the pixel defining layer 530 is positioned in the display region II and exposes a portion of the first electrode 350 on which the emission layer 390 is disposed. The second opening of the pixel defining layer 370 is positioned in the transparent region III and defined as the transparent window 382. According to an example embodiment, the second opening may be formed by disposing the pixel defining layer 530 on the first insulating layer 250 in the entire transparent region III, disposing the second electrode 510 on the pixel defining layer 530, and then removing a portion of the pixel defining layer 530 and the second electrode 510 in the transparent window 382. The pixel defining layer 530 may include an organic material, an inorganic material, or a combination thereof. The pixel defining layer 530 may include materials that are substantially the same as those of the second insulating layer 330.

The second electrode 510 of FIG. 4 is disposed on portions of the pixel defining layer 530 and the emission layer 390. The second electrode 510 may include a transparent conductive material. According to an example embodiment, the second electrode 510 may be disposed with a substantially uniform thickness along a profile of the pixel defining layer 530, the emission layer 390, and the first insulating layer 250, and then removed along a profile of the second opening such that the second electrode 510 does not remain in contact with the first insulating layer 250. In this way, incident light is not reflected by a contact interface of the first insulating layer 250 and the second electrode 510 and also not refracted by the same, which may otherwise occur if the first insulating layer 250 and the second electrode 510 have different refraction indexes. Accordingly, when the second electrode 510 is not disposed in the second opening, the light transmittivity of the transparent region III may be substantially increased. Furthermore, as the refraction or reflection of light is not generated in an interlayer, the definition of objects or images located opposite to the organic light emitting display device 500 also may be increased.

Figure 5:
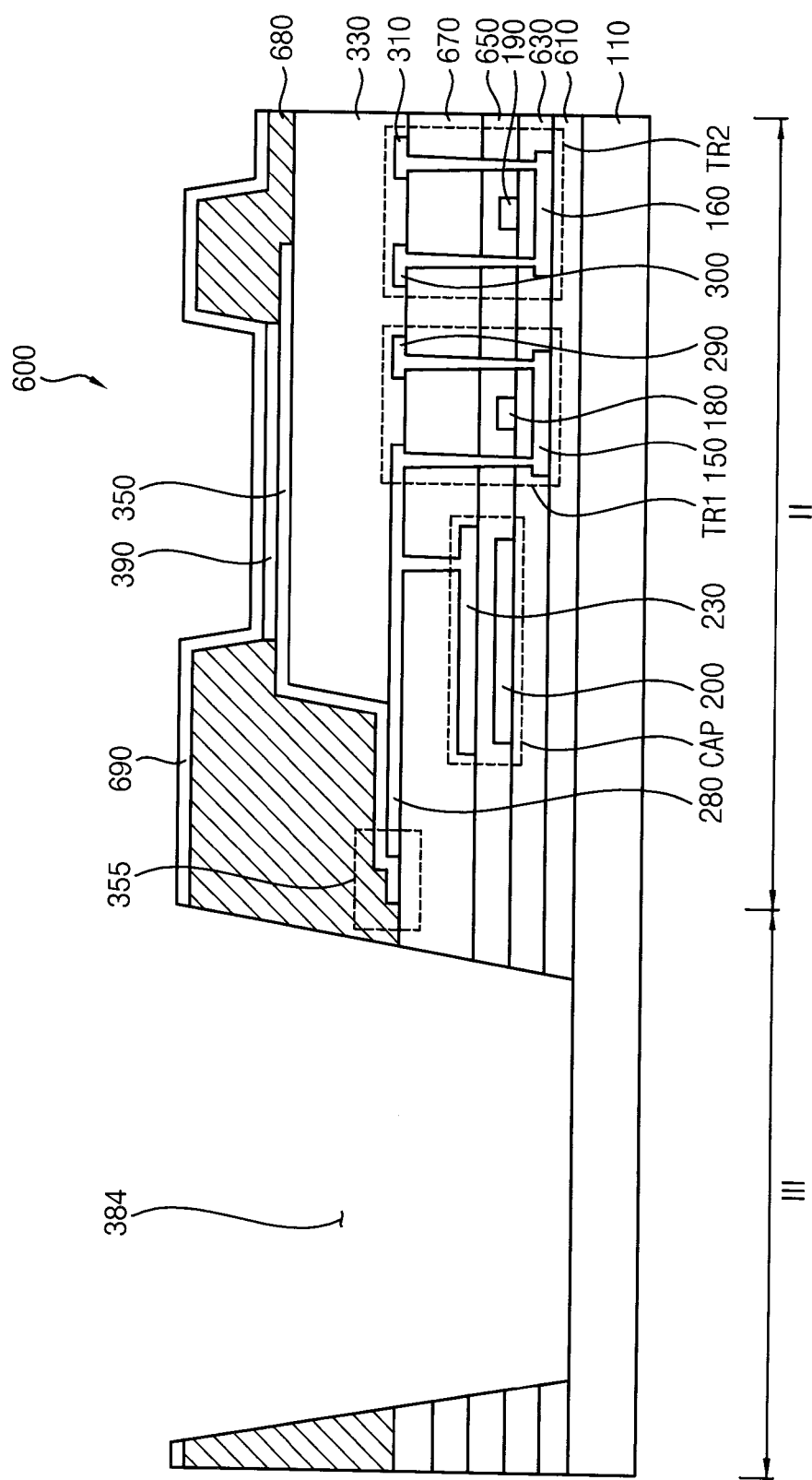
FIG. 5 is a cross-sectional view illustrating an organic light emitting display device in accordance with an example embodiment.

FIG. 5 is a cross-sectional view illustrating an organic light emitting display device in accordance with an example embodiment. FIG. 5 shows an organic light emitting display device 600 that differs from that of FIG. 3 a least in the shape of a transparent window 384, a buffer layer 610, an insulating interlayer 630, a gate insulating layer 650, a pixel defining layer 680, and a second electrode 690. For elements of FIG. 5 that are substantially the same as or similar to the elements described earlier with reference to FIG. 3, their descriptions are omitted.

Referring to FIG. 5, an organic light emitting display device 600 includes a substrate 110, a driving transistor TR1, a switching transistor TR2, a storage capacitor CAP, an extension of a drain electrode 280, a buffer layer 610, an insulating interlayer 630, a gate insulating layer 650, a first insulating layer 670, a second insulating layer 330, a first electrode 350, a pixel defining layer 680, a transparent window 384, an emission layer 390, and a second electrode 690.

The transparent window 384 of FIG. 5 is disposed on the substrate 110 in the transparent region III. According to an example embodiment, after the buffer layer 610, the insulating interlayer 630, the 690 gate insulating layer 650, the first insulating layer 670, the pixel defining layer 680, and the second electrode 690 are formed on the substrate 110 in the entire transparent region III, a first opening may be formed by removing a portion of the buffer layer 610, a portion of the insulating interlayer 630, a portion of the gate insulating layer 650, a portion of the first insulating layer 670, a portion of the pixel defining layer 680, and a portion of the second electrode 690. The first opening is defined as the transparent window 384 in FIG. 5.

The pixel defining layer 680 may include materials that are substantially the same as those of the second insulating layer 330. The pixel defining layer 680 may include an organic material, an inorganic material, or a combination thereof. The second electrode 690 may include a transparent conductive material. The second electrode 690 may include materials that are substantially the same as those of the first electrode 350.

By forming the transparent window 384 as shown in FIG. 5, incident light is not reflected by contact interfaces of the buffer layer 610, the insulating interlayer 630, the gate insulating layer 650, the first insulating layer 670, the pixel defining layer 680, and the second electrode 690, and also not refracted by the same, which may otherwise occur if the refraction indexes of the first insulating layer 250 and the second electrode 510 are different. Accordingly, when the first opening is disposed in removed portions of the buffer layer 610, the insulating interlayer 630, the gate insulating layer 650, the first insulating layer 670, the pixel defining layer 680, and the second electrode 690, the light transmittivity of the transparent region III may be substantially increased. Furthermore, as the refraction or reflection of light is not generated in an interlayer, the definition of objects or images located opposite to the organic light emitting display device 600 also may be increased.

Figure 6:
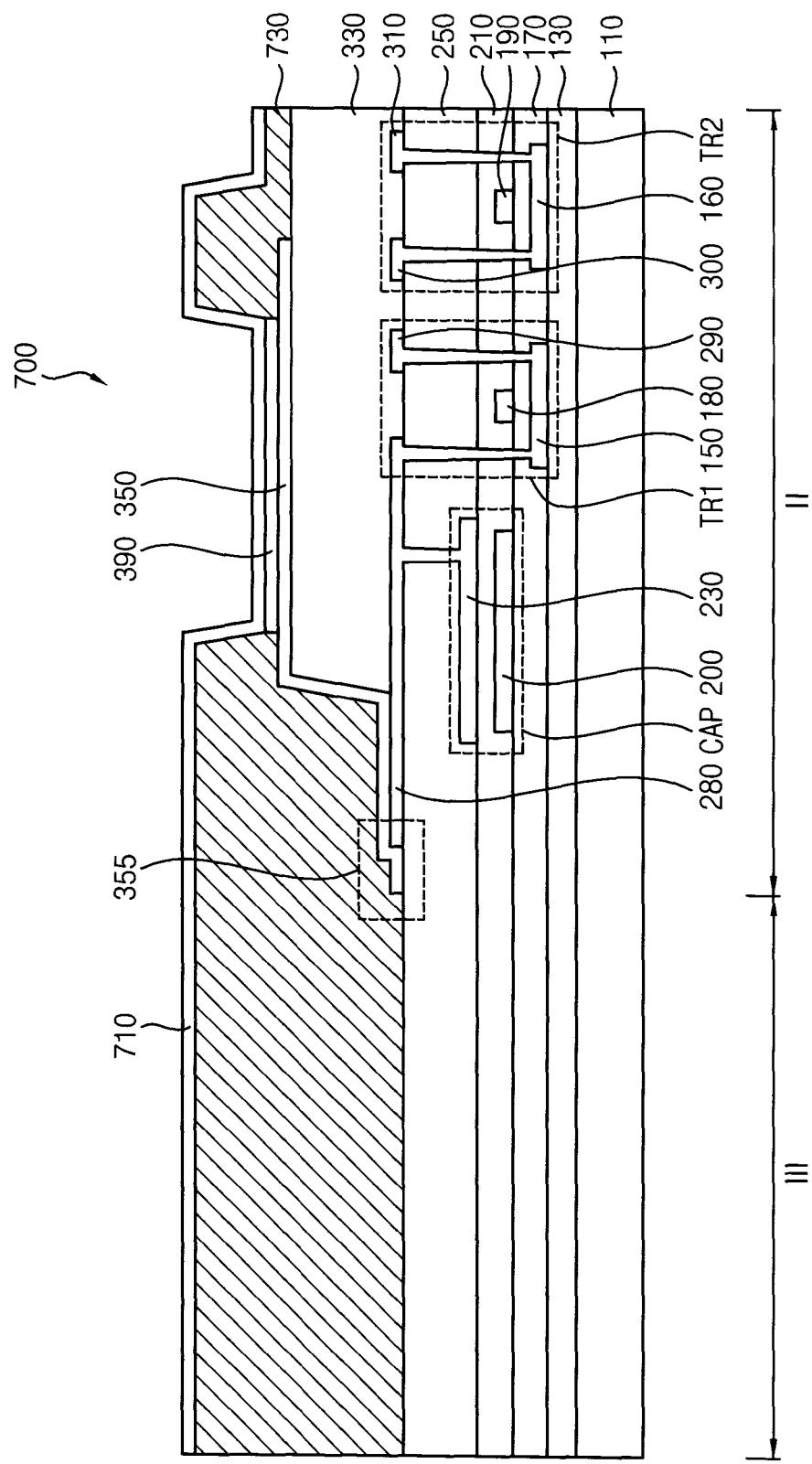
FIG. 6 is a cross-sectional view illustrating an organic light emitting display device in accordance with an example embodiment.

FIG. 6 is a cross-sectional view illustrating an organic light emitting display device in accordance with an example embodiment. FIG. 6 shows an organic light emitting display device 700 that differs from that of FIG. 3 at least in the shape of a pixel defining layer 730 and a second electrode 710. For elements of FIG. 6 that are substantially the same as or similar to the elements described earlier with reference to FIG. 3, their descriptions are omitted.

Referring to FIG. 6, an organic light emitting display device 700 includes a substrate 110, a driving transistor TR1, a switching transistor TR2, a storage capacitor CAP, an extension of a drain electrode 280, a buffer layer 130, an insulating interlayer 170, a gate insulating layer 210, a first insulating layer 250, a second insulating layer 330, a first electrode 350, a pixel defining layer 730, an emission layer 390, and a second electrode 710.

The pixel defining layer 730 of FIG. 6 is disposed on the first electrode 350, a portion of the second insulating layer 330, and a portion of the first insulating layer 250. The pixel defining layer 730 includes a first opening and covers a stepped portion 355. The first opening of the pixel defining layer 730 is positioned in the display region II and exposes a portion of the first electrode 350 on which the emission layer 390 is disposed. The pixel defining layer 730 is disposed on the first insulating layer 250 in the entire transparent region III and may be formed to have a uniform thickness (i.e., a transparent window does not exist).

In the transparent region III, the second electrode 710 of FIG. 5 is disposed on the pixel defining layer 730. In the display region II, the second electrode 710 of FIG. 5 is disposed on a portion of the pixel defining layer 730 and the emission layer 390. The pixel defining layer 730 may include a transparent organic material, a transparent inorganic material, or a combination thereof. When the pixel defining layer 730 includes transparent materials, the manufacturing cost of the organic light emitting display device 700 may be reduced because a process that forms a transparent window by removing a portion of the pixel defining layer 730 in the transparent region III is omitted. In addition, when the pixel defining layer 730 includes the transparent materials, a transmittivity may not be substantially decreased.

According to an example embodiment, the second electrode 710 is disposed with a substantially uniform thickness along a profile of the pixel defining layer 730 and the emission layer 390. The second electrode 710 may include a transparent conductive material. The second electrode 710 may include materials that are substantially the same as those of the first electrode 350. According to another example embodiment, after the second electrode 710 is disposed with a substantially uniform thickness along a profile of the pixel defining layer 730 and the emission layer 390, the second electrode 710 disposed in the transparent region III may be removed. In this case, the transmittivity may be substantially increased in transparent region II.

Figure 7B:
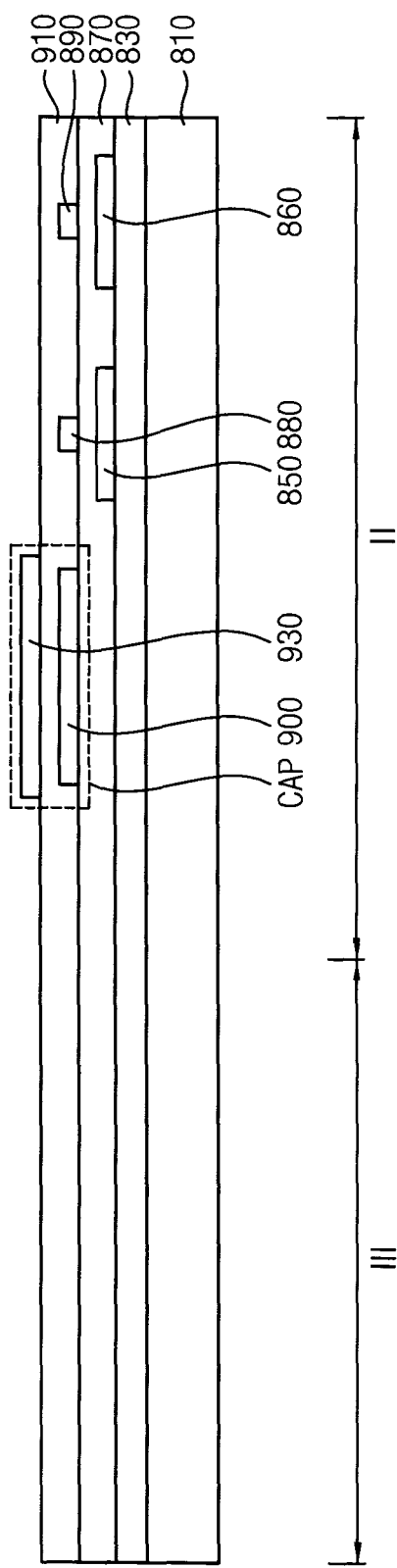

FIGS. 7A to 7G are cross-sectional views illustrating a method of manufacturing an organic light emitting display device in accordance with an example embodiment. Referring to FIG. 7A, a buffer layer 830 is disposed on a substrate 810 and extends from a display region II into a transparent region III. The substrate 810 may be formed, for example, using a transparent inorganic material or a flexible plastic. The buffer layer 830 may be formed, for example, using silicon nitride and/or silicon oxide. When the buffer layer 830 is formed using silicon oxide, external light traveling through the transparent region III of the organic light emitting display device may be transmitted by the buffer layer 830.

First and second active patterns 850 and 860 of FIG. 7A are formed on the buffer layer 830 and spaced apart from each other by a predetermined distance in the display region II. The first and second active patterns 850 and 860 may be formed during the same process step and may include, for example, an oxide semiconductor, an inorganic semiconductor, and/or an organic semiconductor.

An insulating interlayer 870 is formed on the buffer layer 830 of FIG. 7A. The insulating interlayer 870 covers the first and second active patterns 850 and 860 and extends into the transparent region III. The insulating interlayer 870 may be formed, for example, from a silicon compound and/or a metal oxide. According to an example embodiment, the insulating interlayer 870 may be formed using materials that are substantially the same as those of the buffer layer 830, the insulating interlayer 870 and the buffer layer 830, in which case the different layers have the same refractive index and the light transmittivity is improved in the transparent region III.

FIG. 7A shows that a first gate electrode 880 is formed on the insulating interlayer 870 under which the first active pattern 850 is formed, and a second gate electrode 890 is formed on the insulating interlayer 870 under which the second active pattern 860 is formed. A first capacitor electrode 900 is also formed on the insulating interlayer 870 and spaced apart from the first gate electrode 880 by a predetermined distance. The first gate electrode 880, the second gate electrode 890, and the first capacitor electrode 900 may be formed during the same process step and may include, for example, a metal, an alloy, a metal nitride, a conductive metal oxide, and/or a transparent conductive material.

Referring to FIG. 7B, a gate insulating layer 910 is formed on the insulating interlayer 870. The gate insulating layer 910 covers the first capacitor electrode 900, the first gate electrode 880, and the second gate electrode 890 and extends into the transparent region III. The gate insulating layer 810 may be formed, for example, using a silicon compound and/or a metal oxide. According to an example embodiment, the gate insulating layer 910 may be formed using materials that are substantially the same as those of the buffer layer 830 and the insulating interlayer 870, in which case the gate insulating layer 910, the insulating interlayer 870 and the buffer layer 830 have the same refractive index and the light transmittivity is improved in the transparent region III.

As FIG. 7B further shows, a second capacitor electrode 930 is formed on the gate insulating layer 910 under which the first capacitor electrode 900 is formed. The first capacitor electrode 900 and the second capacitor electrode 930 together form a storage capacitor CAP. The second capacitor electrode 930 may be formed using materials that are substantially the same as those of the first gate electrode 880, the second gate electrode 890, and the first capacitor electrode 900. In some cases, each of the second capacitor electrode 930, the first gate electrode 180, the second gate electrode 190, and the first capacitor electrode 200 may include different materials.

Figure 7C:
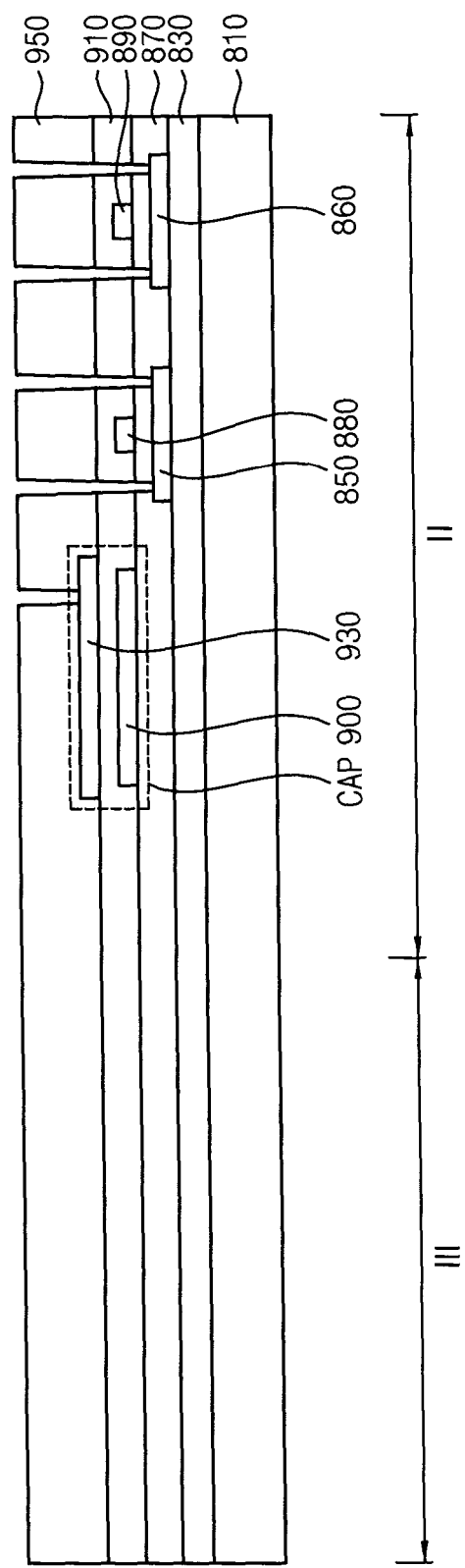

Referring to FIG. 7C, a first insulating layer 950 is formed on the gate insulating layer 910, while covering the second capacitor electrode 930 and extending into the transparent region III. The first insulating layer 950 may be formed, for example, using a silicon compound and/or a metal oxide. After the first insulating layer 950 is formed, first through fifth contact holes are formed in the display region II of the first insulating layer 950. A first portion of the second capacitor electrode 930 is exposed through the first contact hole. A second portion and a third portion of the first active pattern 850 are exposed through each of the second and third contact holes, respectively. A fourth portion and a fifth portion of the second active pattern 860 are exposed through each of the fourth and fifth contact holes, respectively. According to an example embodiment, the first insulating layer 950 may be formed of materials that are substantially the same as those of the gate insulating layer 910, the buffer layer 830 and the insulating interlayer 870, in which case the first insulating layer 950, the gate insulating layer 910, the insulating interlayer 870 and the buffer layer 830 have the same refractive index in the transparent region III and the light transmittivity is improved in the transparent region III.

Figure 7D:
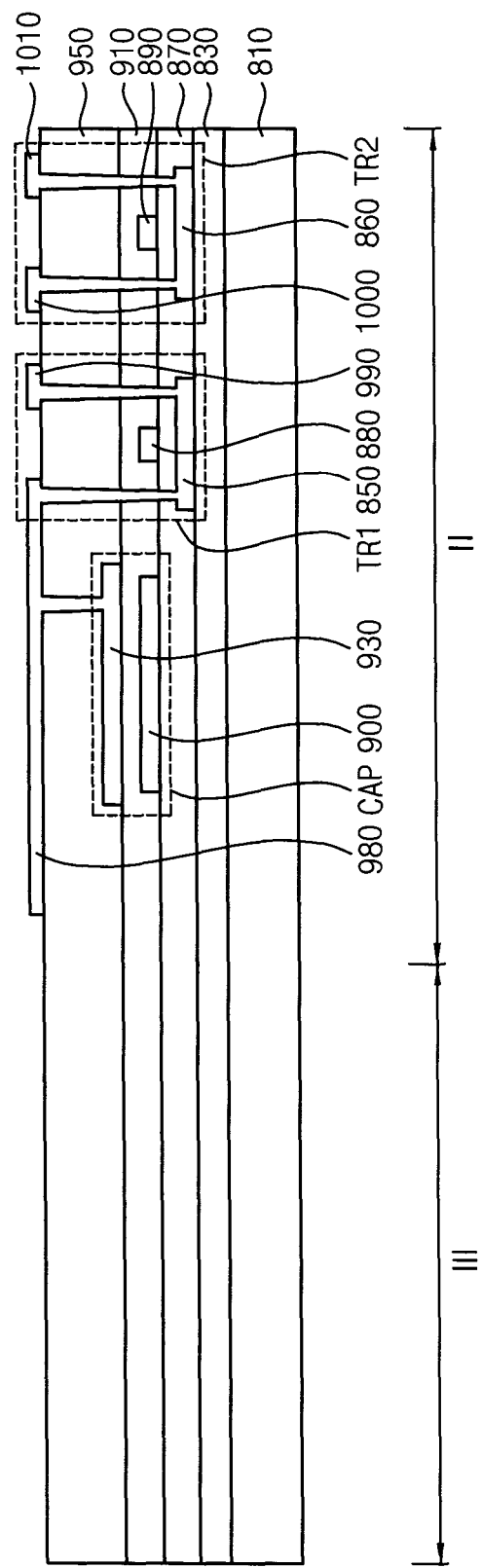

Referring to FIG. 7d, an extension of a drain electrode 980, a first source electrode of a driving transistor TR1, a first drain electrode 990 of the driving transistor TR1, a second source electrode 1000 of a switching transistor TR2, and a second drain electrode 1010 of the switching transistor TR2 are formed in the display region II of the first insulating layer 950. At least a first portion of the extension of a drain electrode 980 of FIG. 7D fills the first contact hole and extends into the first contact hole to contact the first portion of the second capacitor electrode 930.

A second portion of the extension of a drain electrode 980 of FIG. 7D, also referred to herein as the first source electrode of the driving transistor TR1, fills the second contact hole and extends into the second contact hole to contact the second portion of the first active pattern 850. In a similar manner, the first drain electrode 990 of FIG. 7D fills the third contact hole and extends into the third contact hole to contact the third portion of the first active pattern 850. The first source electrode, the first drain electrode 990, the first gate electrode 880, and the first active pattern 850 together form the driving transistor TR1.

The second source electrode 1000 of FIG. 7D fills the fourth contact hole and extends into the fourth contact hole to contact to the fourth portion of the second active pattern 860. Similarly, the second drain electrode 1010 fills the fifth contact hole and extends into the fifth contact hole to contact to the fifth portion of the second active pattern 860. The second source electrode 1000, the second drain electrode 1010, the second gate electrode 890, and the second active pattern 860 together form the switching transistor TR2. The extension of a drain electrode 980, the first source electrode, the first drain electrode 990, the second source electrode 1000, the second drain electrode 1010 may be formed during the same process step and may include, for example, a metal, an alloy, a metal nitride, a conductive metal oxide, and/or a transparent conductive material.

Figure 7E:
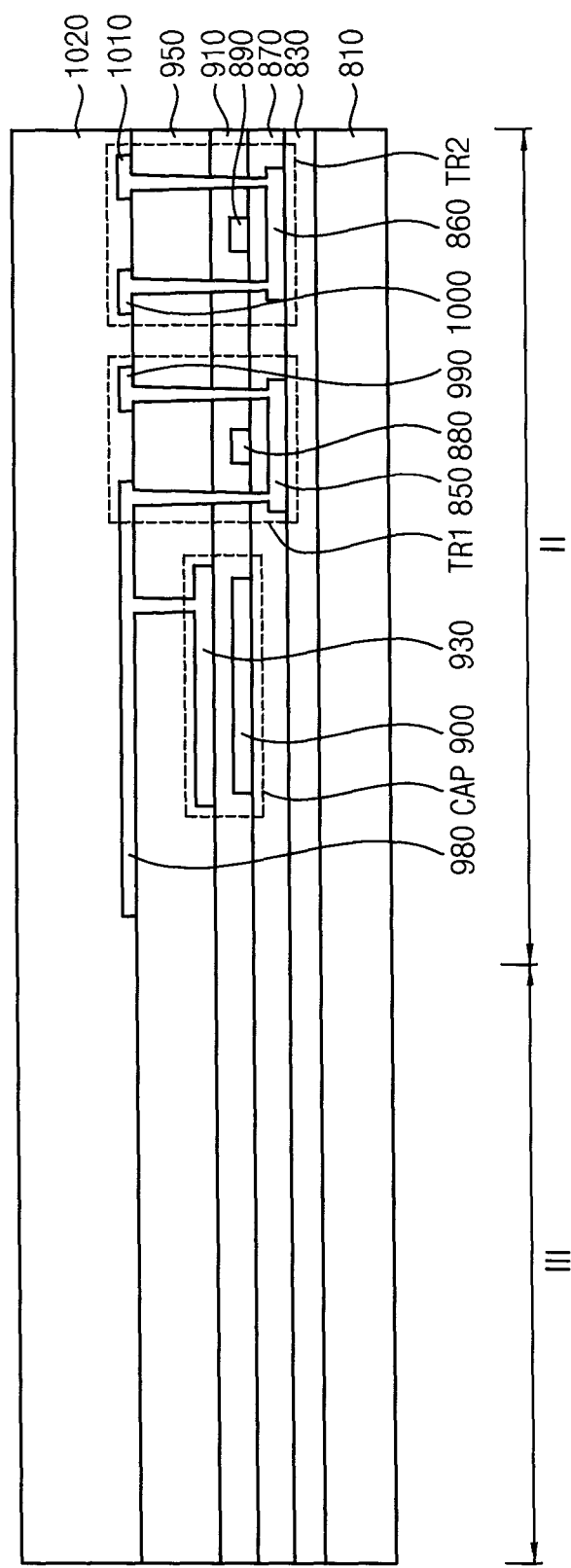

Referring to FIG. 7E, a preliminary second insulating layer 1020 is formed on the first insulating layer 950 and covers the extension of a drain electrode 980, the first drain electrode 990 of the driving transistor TR1, the second source electrode 1000 of the switching transistor TR2, and the second drain electrode 1010 of the switching transistor TR2. The preliminary second insulating layer 1020 may be formed, for example, using an inorganic material such as SiOx, SiNx, SiOxNy, SiOxCy, SiCxNy, or a combination thereof. In some example embodiments, the preliminary second insulating layer 1020 may be formed using an organic material such as polyimide-based resin, photoresist, acrylic-based resin, polyamide-based resin, siloxane-based resin, or a combination thereof.

Figure 7F:
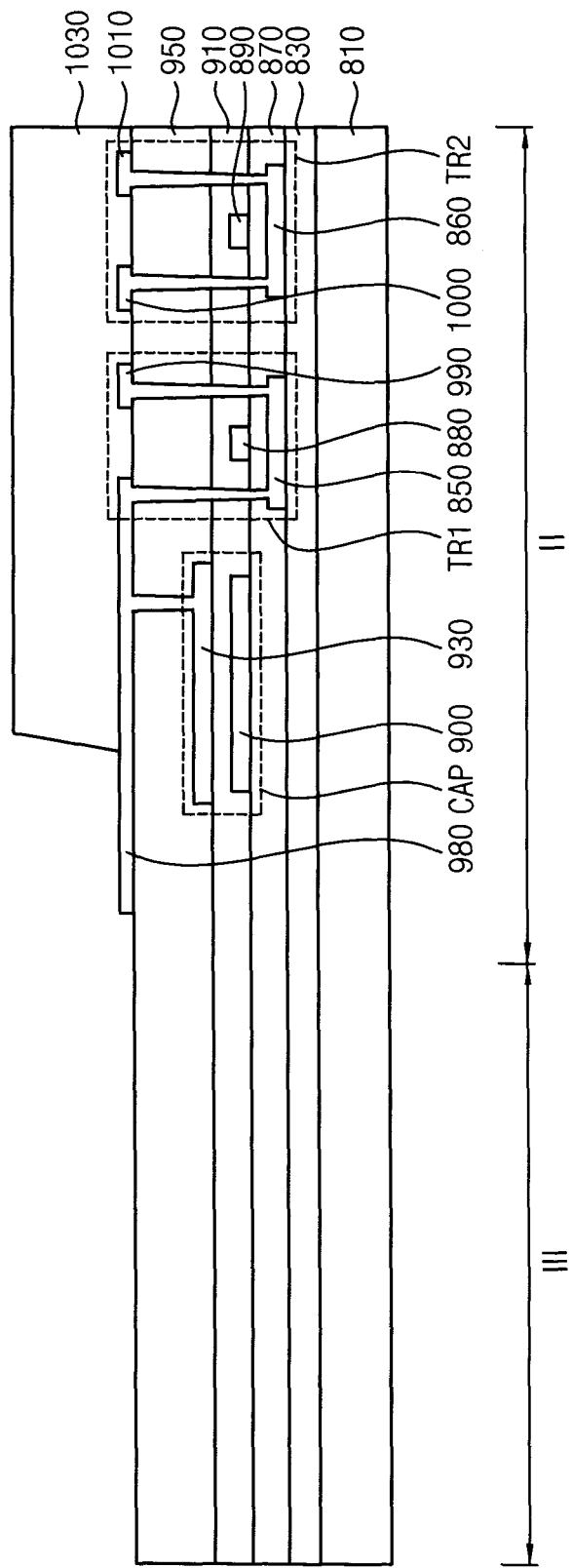

Referring to FIG. 7F, a second insulating layer 1030 is formed such that it overlaps with only a portion of the extension of a drain electrode 980. According to an example embodiment, the second insulating layer 1030 may be formed initially to cover both the transparent region III and the display region II. Then, subsequently, portions of the second insulating layer 1030 in the display region II and all of the second insulating layer 1030 in the transparent region III may be removed such that at least a portion of the extension of a drain electrode 980 is exposed by the second insulating layer 1030.

Figure 7G:
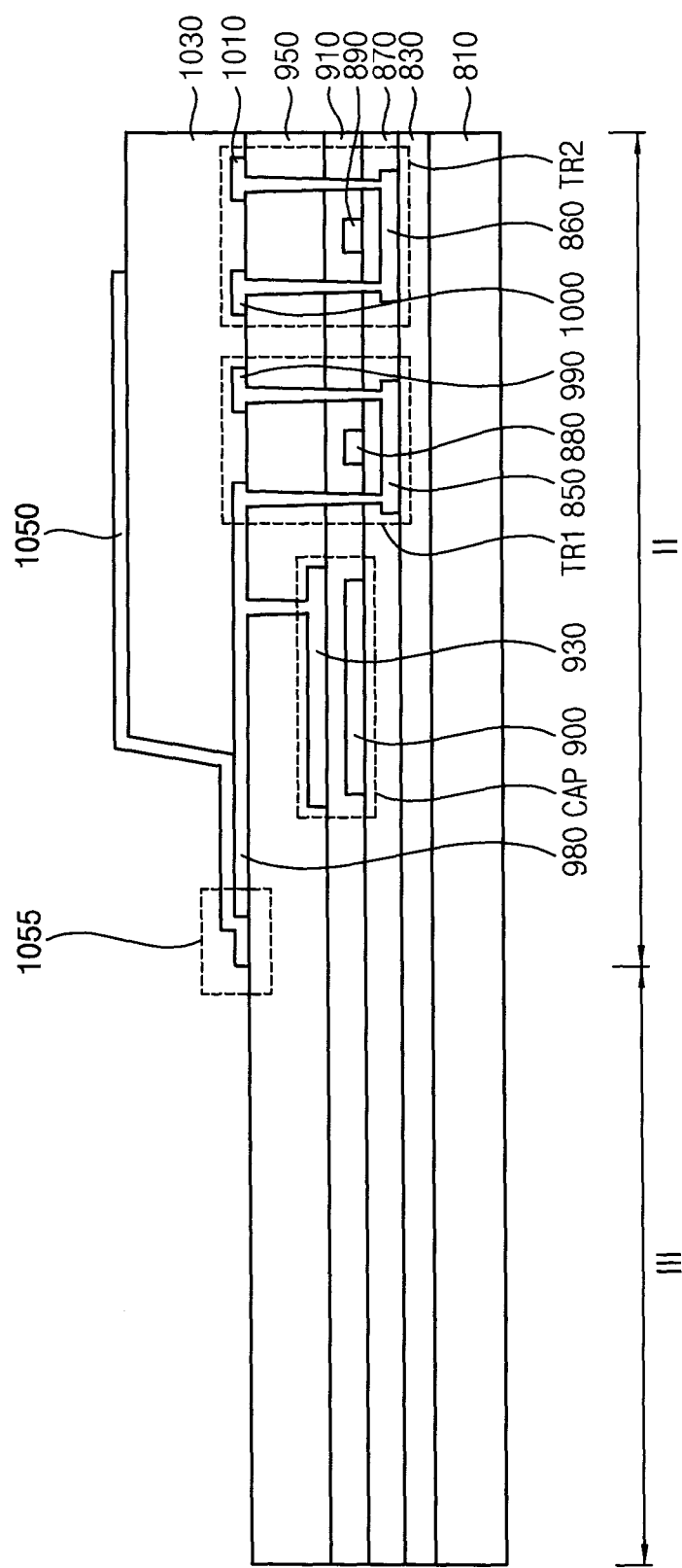

Referring to FIG. 7G, a first electrode 1050 is formed on a portion of the first insulating layer 950, a portion of the extension of a drain electrode 980, and a portion of the second insulating layer 1030. The first electrode 1050 may be formed, for example, using a metal, an alloy, a metal nitride, a conductive metal oxide, and/or a transparent conductive material. As a further example, the first electrode 1050 may include materials such as Al, aluminum alloy, AlNx, Ag, silver alloy, W, WNx, Cu, copper alloy, Ni, Cr, CrNx, Mo, molybdenum alloy, Ti, TiNx, Pt, Ta, TaNx, Nd, Sc, SRO, ZnOx, ITO, SnOx, InOx, GaOx, and IZO. These materials may be used alone or in a combination thereof.

The first electrode 1050 may be formed with a substantially uniform thickness along a profile of the extension of a drain electrode 980 and the second insulating layer 1030. As FIG. 7G illustrates, in a portion adjacent to a boundary of the display region II and the transparent region III, the first electrode 1050 covers the extension of a drain electrode 980 such that the extension of a drain electrode 980 is not exposed in the outside and extends onto the first insulating layer 950. That is, a stepped portion 1055 is formed adjacent to the boundary of the display region II and the transparent region III such that at least a portion of the first electrode 1050 contacts the first insulating layer 250. Because the first electrode 1050 covers the top portion of the extension of a drain electrode 980 that is exposed by the second insulating layer 1030, and the stepped portion 355 of the first electrode 1050 covers the side walls of the extension of a drain electrode 980, the extension of a drain electrode 980 is protected. For example, if the first electrode 1050 does not include the stepped portion 1055 and is formed of a different material than the extension of a drain electrode 980, the extension of a drain electrode 980 can be damaged by etching materials during an etching process of the first electrode 1050.

According to an example embodiment in which a width (e.g., a length of the extension of a drain electrode 980 in the horizontal direction of FIG. 7G) of the extension of a drain electrode 980 is reduced, the stepped portion 1055 may be formed more closely to the second insulating layer 1030, thereby increasing the area of the transparent region III. In such case, however, reducing the width of the extension of a drain electrode 1080 may cause an IR drop in the organic light emitting display device because a line resistance may be increased. An IR drop may degrade the quality of an image displayed in the organic light emitting display device. Accordingly, the width of the extension of a drain electrode 980 may be determined so as to not cause an IR drop.

Figure 7H:
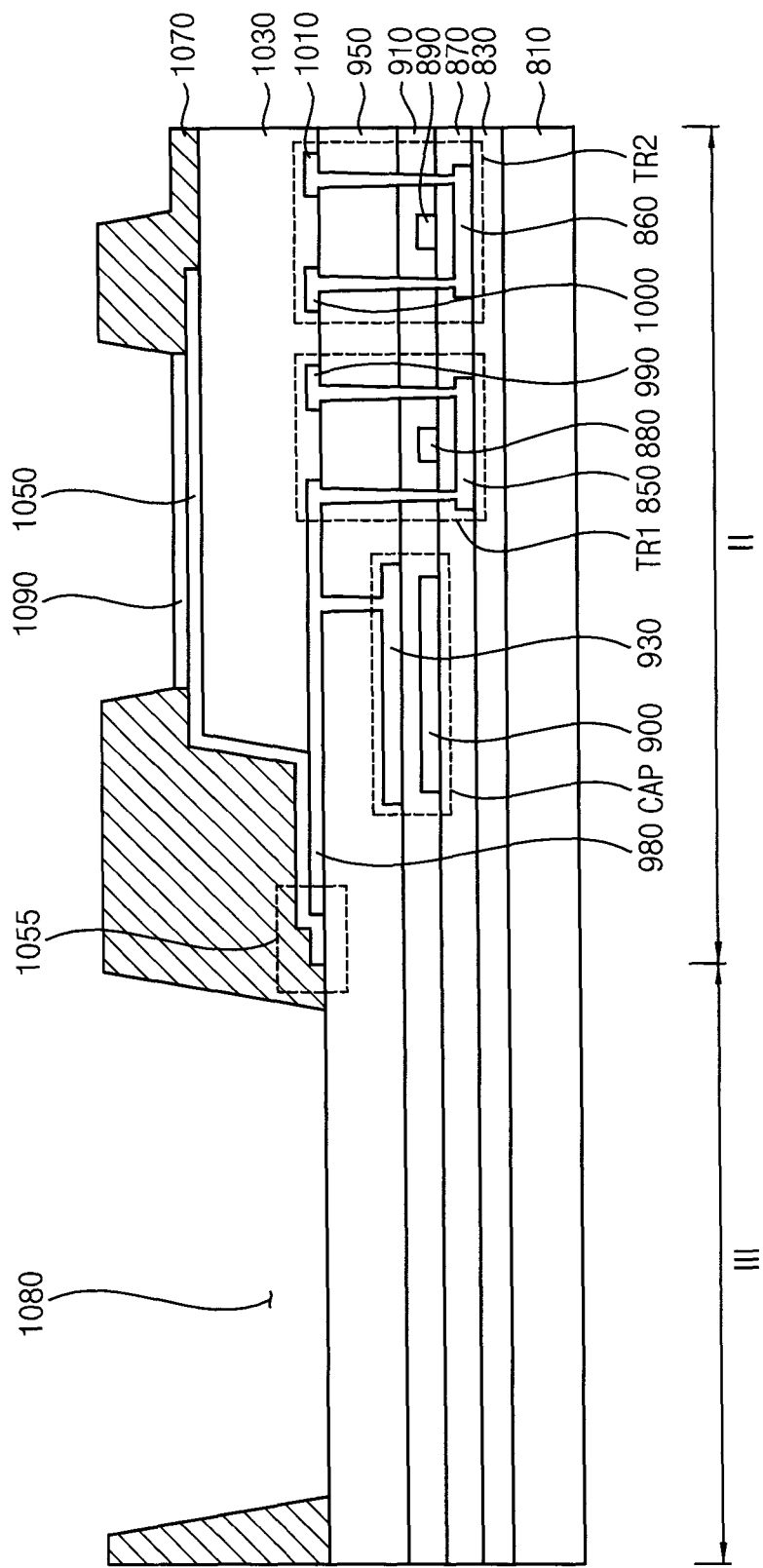
Figure 71:
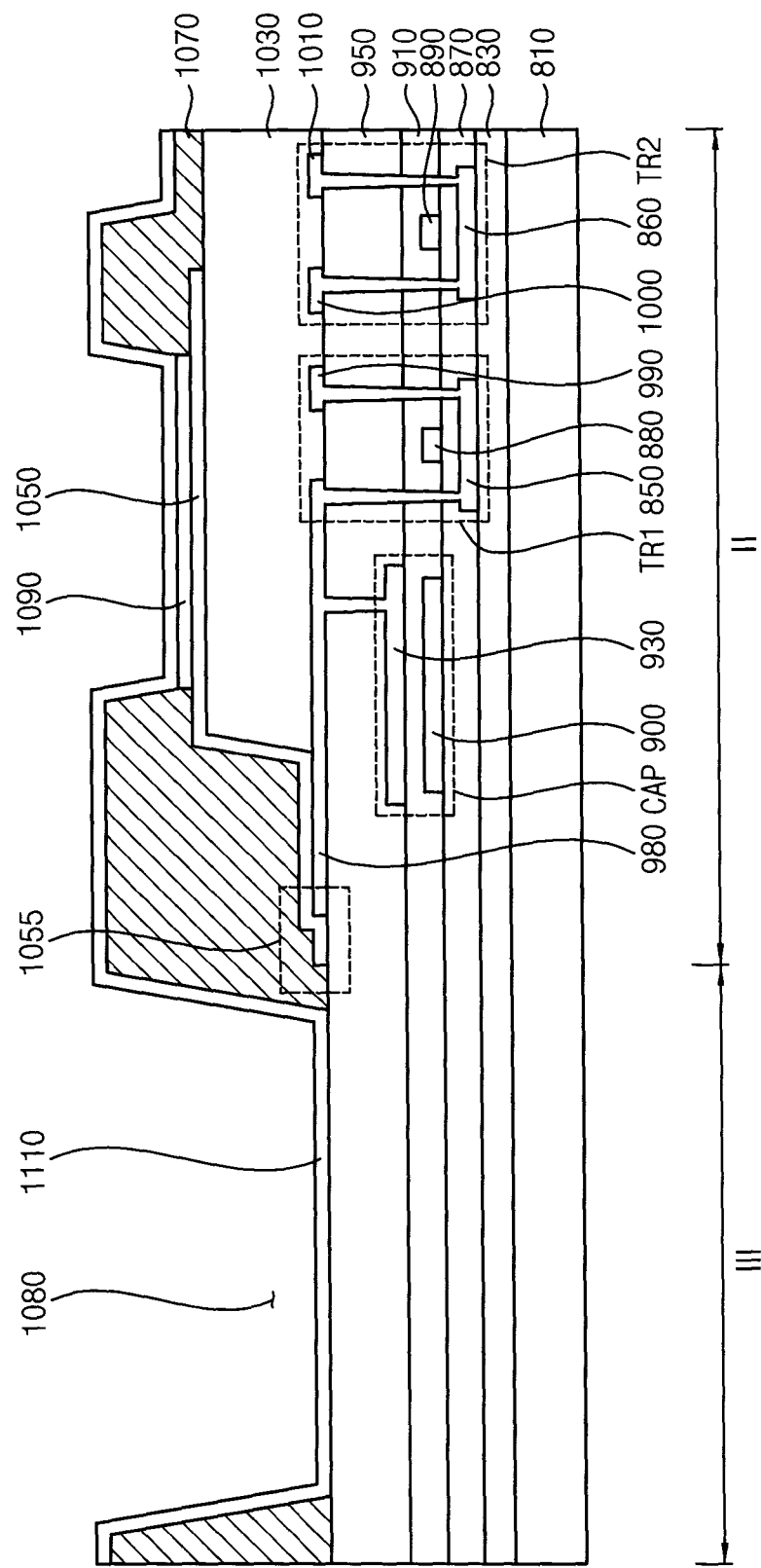

Referring to FIG. 7H, a pixel defining layer 1070 is formed on the first electrode 1050, a portion of the second insulating layer 1030, and a portion of the first insulating layer 950. The pixel defining layer 1070 may be formed using an organic material or an inorganic material. The pixel defining layer 1070 includes a first opening and a second opening and covers the stepped portion 1055.

The first opening of the pixel defining layer 1070 is formed in the display region II and exposes a portion of the first electrode 1050 on which an emission layer 1090 is formed. The emission layer 1090 may be formed of light emitting materials that are capable of generating different colors of light (e.g., red color light, blue color light, and green color light). The emission layer 1090 may include multilayers of light emitting materials, wherein each layer is capable of generating a different color of light, such as red color light, green color light, and blue color light.

The second opening of the pixel defining layer 1070 is formed in the transparent region III and defines a transparent window 1080. The pixel defining layer 1070 may include materials that are substantially the same as those of the second insulating layer 1030.

Referring to FIG. 7I, a second electrode 1110 is formed on the pixel defining layer 1070, the emission layer 1090, and the first insulating layer 950. The second electrode 1110 may be formed, for example, using ITO, SnOx, InOx, GaOx, and/or IZO, which does not substantially reduce the light transmittivity of the transparent region III. The second electrode 1110 may include materials that are substantially the same as those of the first electrode 1050. The second electrode 1110 may be formed with a substantially uniform thickness along a profile of the pixel defining layer 1070, the emission layer 1090, and the first insulating layer 950. The second electrode 1110 is in contact with a portion of the first insulating layer 950 via the second opening of the pixel defining layer 1070 and extends into the transparent region III. That is, the second electrode 1110 extends into the second opening.

The example embodiments of the present system and method may be applied to various display devices including an organic light emitting display device. The foregoing example embodiments are provided for illustrative purposes. The present system and method, however, are not limited to these example embodiments. Those skilled in the art would appreciate that modifications to the example embodiments are within the scope of the present system and method.

What is claimed is:

1. An organic light emitting display device comprising:
    a substrate having a display region and a transparent region;
    a first insulating layer disposed on the substrate;
    an extension of a drain electrode disposed on the first insulating layer, the extension of the drain electrode constituting a semiconductor element in conjunction with an active pattern, a gate electrode, and a source electrode;
    a second insulating layer disposed on the extension of the drain electrode such that an edge portion of the extension of the drain electrode is free from overlap with the second insulating layer, the side edge portion of the extension of the drain electrode extending in a direction from the display region into the transparent region;
    a first electrode disposed on the second insulating layer and in contact with the edge portion of the extension of the drain electrode;
    an emission layer disposed on the first electrode; and
    a second electrode disposed on the emission layer,
    wherein at least a portion of the first electrode is in direct contact with the first insulating layer, and
    wherein the first electrode covers the side edge portion of the extension of the drain electrode such that the side edge portion of the extension of the drain electrode is not exposed in a cross-sectional view of the organic light emitting display device.

2. The organic light emitting display device of claim 1, wherein the first electrode covers the edge portion of the extension of the drain electrode and is positioned adjacent to a boundary of the display region and the transparent region.

3. The organic light emitting display device of claim 1, wherein the extension of the drain electrode is electrically connected to the first electrode and surrounded by the first electrode and the second insulating layer.

4. The organic light emitting display device of claim 1, further comprising:
a pixel defining layer disposed on the first insulating layer and covering the first electrode positioned on the extension of the drain electrode.

5. The organic light emitting display device of claim 4, wherein the pixel defining layer includes a transparent material.

6. The organic light emitting display device of claim 4, wherein the pixel defining layer includes:
a first opening positioned in the display region and in which the emission layer is disposed; and
a second opening positioned in the transparent region.

7. The organic light emitting display device of claim 6, wherein the second opening is formed by removing the pixel defining layer.

8. The organic light emitting display device of claim 7, wherein the second electrode extends into the second opening.

9. The organic light emitting display device of claim 6, wherein the second opening is formed by removing the pixel defining layer and the first insulating layer.

10. The organic light emitting display device of claim 1, wherein the extension of the drain electrode and the first electrode are disposed in the display region.

11. The organic light emitting display device of claim 1, further comprising:
at least one semiconductor device disposed between the substrate and the second insulating layer;
an insulating interlayer disposed on the substrate; and
a capacitor disposed between the insulating interlayer and the extension of the drain electrode.

12. The organic light emitting display device of claim 11, wherein:
the at least one semiconductor device includes a first semiconductor that includes a first active pattern disposed on the substrate,
the insulating interlayer is disposed on the first active pattern, a first gate electrode is disposed on the insulating interlayer,
the extension of the drain electrode contacts a first portion of the first active pattern and extends adjacent to a boundary of the display region and the transparent region, and a first drain electrode contacts a second portion of the first active pattern.

13. The organic light emitting display device of claim 12, wherein the capacitor includes:
a lower electrode disposed on the insulating interlayer,
an upper electrode contacting an extended portion of the extension of the drain electrode and disposed on the lower electrode, and
a gate insulating layer disposed between the lower electrode and the upper electrode.

14. The organic light emitting display device of claim 13, wherein the lower electrode and the first gate electrode are positioned at a same level on the insulating interlayer.

15. The organic light emitting display device of claim 13, wherein a power supply voltage is applied to the first electrode, the first portion of the first active pattern, and the upper electrode via the extension of the drain electrode.

16. The organic light emitting display device of claim 13, wherein the gate insulating layer includes materials that are substantially the same as materials of the first insulating layer.

17. The organic light emitting display device of claim 11, wherein:
the at least one semiconductor device includes a second semiconductor that includes a second active pattern disposed on the substrate,
the insulating interlayer is disposed on the second active pattern,
a second gate electrode is disposed on the insulating interlayer,
a second source electrode contacts a first portion of the second active pattern, and
a second drain electrode contacts a second portion of the second active pattern.

18. The organic light emitting display device of claim 1, further comprising a driving transistor that extends through the first insulating layer to connect to the extension of the drain electrode.

19. An organic light emitting display device comprising:
a substrate having a display region and a transparent region;
a first insulating layer disposed on the substrate;
an extension of a drain electrode disposed on the first insulating layer;
a second insulating layer disposed on the extension of the drain electrode such that an edge portion of the extension of the drain electrode is free from overlap with the second insulating layer;
a first electrode disposed on the second insulating layer and in contact with the edge portion of the extension of the drain electrode;
an emission layer disposed on the first electrode and not disposed in the transparent region;
a pixel defining layer disposed on the first insulating layer and covering the first electrode positioned on the extension of the drain electrode, the pixel defining layer including:
a first opening positioned in the display region and in which the emission layer is disposed; and
a second opening positioned in the transparent region; and
a second electrode disposed on the emission layer,
wherein the first electrode and the emission layer are overlapped in a plan view, and wherein the second electrode extends into the second opening.

* * * * *